(12) United States Patent
Yang et al.

(10) Patent No.: US 7,037,447 B1
(45) Date of Patent: May 2, 2006

(54) CONDUCTIVE INK COMPOSITIONS

(75) Inventors: Kang Yang, San Diego, CA (US); Puwei Liu, San Diego, CA (US)

(73) Assignee: Henkel Corporation, Rocky Hill, CT (US)

( * ) Notice: Subject to any disclaimer, the term of this patent is extended or adjusted under 35 U.S.C. 154(b) by 272 days.

(21) Appl. No.: 10/626,008

(22) Filed: Jul. 23, 2003

(51) Int. Cl.
*H01B 1/22* (2006.01)
*B05D 5/12* (2006.01)

(52) U.S. Cl. ............. 252/512; 252/514; 427/96.1

(58) Field of Classification Search ........... 252/512, 252/513, 514; 225/514; 427/96.1; 526/262
See application file for complete search history.

(56) References Cited

U.S. PATENT DOCUMENTS

| | | | |
|---|---|---|---|
| 4,552,690 A | * | 11/1985 | Ikeguchi et al. ............ 252/512 |
| 4,756,756 A | * | 7/1988 | Cassat ....................... 524/261 |
| 5,789,757 A | | 8/1998 | Husson, Jr. et al. |
| 6,034,195 A | | 3/2000 | Dershem et al. |
| 6,187,886 B1 | | 2/2001 | Husson, Jr. et al. |
| 6,322,620 B1 | | 11/2001 | Xiao |
| 6,350,841 B1 | | 2/2002 | Schultz et al. |

* cited by examiner

*Primary Examiner*—Mark Kopec
(74) *Attorney, Agent, or Firm*—Steven C. Bauman

(57) ABSTRACT

The present invention provides a thermoset conductive ink for use in through hole interconnections or similar electric and electronic applications to provide stable electrical connections. The conductive ink of this invention comprises a thermal curable resin system having an admixture of one or more maleimide, nadimide, or itaconimide containing resins, a comonomer and a catalyst, an electrically conductive material such as silver, copper or silver-coated copper, and optionally an organic solvent.

34 Claims, No Drawings

CONDUCTIVE INK COMPOSITIONS

FIELD OF THE INVENTION

This invention relates to electrically conductive ink compositions having improved properties for use in various electronic applications, and to methods of using the same.

BACKGROUND OF THE INVENTION

Many different forms of electronic devices employ printed circuit boards having electronically conductive ink compositions. Conductive ink compositions are screen printable and are used to form conductive elements in electronic applications. For example, conductive inks are utilized as screen-printed electronic circuitry in through hole connection, jumpers, printed board wiring and similar electronic applications to provide stable electrical interconnections. In addition, conductive inks may be used in the production of capacitors.

Most currently available conductive inks generally consist of phenolic resin. Some currently available conductive inks also contain an epoxy resin or a mixture of resins, such as acetylacetone with cyanic acid ester resin or acrylic resin with melamine resin. Such compositions also contain electrically conductive filler materials which are dispersed in the resins and which remain an integral part of the final composition after processing. For example, U.S. Pat. No. 6,322,620 discloses a conductive ink comprising at least one epoxy resin, methoxymethylmelamine (a crosslinking agent), a particulated electrically conductive material and an organic solvent.

There are many drawbacks to currently available conductive inks. One such drawback is that many conductive inks have very short shelf-lives at room temperature. These inks are very difficult to transport and store. Shipping, in particular, is quite difficult in that the inks must be maintained within a coolant, such as dry ice, for the duration of the transit. A further drawback of conductive inks is that they frequently require high drying and curing temperatures and relatively long drying and curing times. Consequently, it would be advantageous to develop a conductive ink which would exhibit long shelf life at room temperature. Furthermore, it would be advantageous to provide an ink that requires lower drying and curing temperatures at shorter drying and curing times.

Additional properties are also desired in a thermoset conductive ink. One such desired property is that the conductive ink be sufficiently conductive, or have low electrical resistivity, to carry an electric current when cured. Other desired properties are that the conductive ink have good abrasion and chemical resistance when cured so that it is not easily scratched or wiped off by solvent and that it have good adhesion to the substrate, commonly a copper substrate, when cured. Further, it is desired that the conductive ink provide appropriate rheology for good screen printability and be stable at relatively high temperatures on the substrate so that it remains unaffected by any heat treatment which may be necessary.

Accordingly, it would be advantageous to provide a conductive ink which has a long shelf life at room temperature, low drying and curing temperatures and short drying and curing times. It would be further advantageous to provide such a conductive ink having other desired benefits as well.

SUMMARY OF THE INVENTION

In accordance with the present invention, it has been discovered that conductive inks incorporating maleimide, nadimide, and/or itaconimide-containing resins exhibit advantageous shelf life, short curing and drying times, and low curing and drying temperatures. In addition, conductive inks of the present invention have good screen printability, high temperature stability, good cohesive strength and chemical resistance, and good adhesion to copper substrates. The invention further provides methods for using such conductive inks to produce capacitors and provide stable electrical connections with printed circuit boards.

DETAILED DESCRIPTION OF THE INVENTION

Conductive inks of the present invention provide stable electrical connections and include:
(a) a thermally curable resin system comprising
(i) one or more of a maleimide, nadimide, or itaconimide,
(ii) optionally, a comonomer, and
(iii) a catalyst;
(b) a particulated electrically conductive material; and
(c) optionally, an organic solvent.

Other optional ingredients include flow additives, adhesion promoters, rheology modifiers, electrical enhancers, stabilizers, and mixtures of any two or more thereof.

In some embodiments, the conductive ink of the present invention includes:
(a) in the range of about 1 to 20 weight percent of the thermally curable resin system, wherein the weight ratio of the one or more of maleimide, nadimide, or itaconimide/comonomer/catalyst in the resin system falls in the range of about 2–100/4–200/1;
(b) in the range of about 40 to 90 weight percent of the particulated electrically conductive material;
(c) in the range of about 0 to 50 weight percent of the organic solvent; and
(d) in the range of about 0 to 10 weight percent of at least one additional component selected from the group consisting of flow additives, adhesion promoters, rheology modifiers, electrical enhancers, stabilizers, and mixtures of any two or more thereof;
wherein weight percent is based on the total of components (a), (b), (c), and (d).

The one or more maleimide, nadimide, or itaconimide contemplated for use in the practice of the present invention comprise, respectively, the structures I, II, and III:

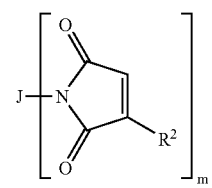

I

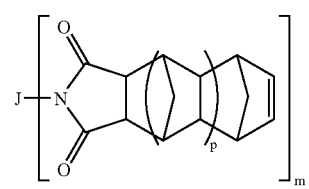

II

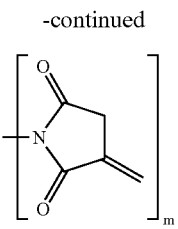

wherein:

m=1–15, p=0–15, each $R^2$ is independently selected from hydrogen or lower alkyl, and J is a monovalent or a polyvalent moiety comprising organic or organosiloxane radicals, and combinations of any two or more thereof.

In some embodiments, J is a monovalent or polyvalent radical selected from the group consisting of hydrocarbyl, substituted hydrocarbyl, heteroatom-containing hydrocarbyl, substituted heteroatom-containing hydrocarbyl, hydrocarbylene, substituted hydrocarbylene, heteroatom-containing hydrocarbylene, substituted heteroatom-containing hydrocarbylene, polysiloxane, polysiloxane-polyurethane block copolymer, and combinations of two or more thereof, optionally containing one or more linkers selected from the group consisting of a covalent bond, —O—, —S—, —NR—, —O—C(O)—, —O—C(O)—O—, —O—C(O)—NR—, —NR—C(O)—, —NR—C(O)—O—, —NR—C(O)—NR—, —S—C(O)—, —S—C(O)—O—, —S—C(O)—NR—, —S(O)—, —S(O)$_2$—, —O—S(O)$_2$—, —O—S(O)$_2$—O—, —O—S(O)$_2$—NR—, —O—S(O)—, —O—S(O)—O—, —O—S(O)—NR—, —O—NR—C(O)—, —O—NR—C(O)—O—, —O—NR—C(O)—NR—, —NR—O—C(O)—, —NR—O—C(O)—O—, —NR—O—C(O)—NR—, —O—NR—C(S)—, —O—NR—C(S)—O—, —O—NR—C(S)—NR—, —NR—O—C(S)—, —NR—O—C(S)—O—, —NR—O—C(S)—NR—, —O—C(S)—, —O—C(S)—O—, —O—C(S)—NR—, —NR—C(S)—, —NR—C(S)—O—, —NR—C(S)—NR—, —S—S(O)$_2$—, —S—S(O)$_2$—O—, —S—S(O)$_2$—NR—, —NR—O—S(O)—, —NR—O—S(O)—O—, —NR—O—S(O)—NR—, —NR—O—S(O)$_2$—, —NR—O—S(O)$_2$—O—, —NR—O—S(O)$_2$—NR—, —O—NR—S(O)—, —O—NR—S(O)—O—, —O—NR—S(O)—NR—, —O—NR—S(O)$_2$—O—, —O—NR—S(O)$_2$—NR—, —O—NR—S(O)$_2$—, —O—P(O)R$_2$—, —S—P(O)R$_2$—, —NR—P(O)R$_2$—, wherein each R is independently hydrogen, alkyl or substituted alkyl, and combinations of any two or more thereof.

As employed herein, "hydrocarbyl" comprises any organic radical wherein the backbone thereof comprises carbon and hydrogen only. Thus, hydrocarbyl embraces alkyl, cycloalkyl, alkenyl, cycloalkenyl, alkynyl, aryl, alkylaryl, arylalkyl, arylalkenyl, alkenylaryl, arylalkynyl, alkynylaryl, and the like.

As employed herein, "substituted hydrocarbyl" comprises any of the above-referenced hydrocarbyl groups further bearing one or more substituents selected from hydroxy, alkoxy (of a lower alkyl group), mercapto (of a lower alkyl group), cycloalkyl, substituted cycloalkyl, heterocyclic, substituted heterocyclic, aryl, substituted aryl, heteroaryl, substituted heteroaryl, aryloxy, substituted aryloxy, halogen, trifluoromethyl, cyano, nitro, nitrone, amino, amido, —C(O)H, acyl, oxyacyl, carboxyl, carbamate, dithiocarbamoyl, sulfonyl, sulfonamide, sulfuryl, and the like.

As employed herein, "alkyl" refers to saturated straight or branched chain hydrocarbon radical having in the range of 1 up to about 500 carbon atoms. "Lower alkyl" refers to alkyl groups having in the range of 1 up to about 5 carbon atoms. "Substituted alkyl" refers to alkyl groups further bearing one or more substituents as set forth above.

As employed herein, "alkenyl" refers to straight or branched chain hydrocarbyl groups having at least one carbon—carbon double bond, and typically having in the range of about 2 up to 500 carbon atoms, and "substituted alkenyl" refers to alkenyl groups further bearing one or more substituents as set forth above.

As employed herein, "alkynyl" refers to straight or branched chain hydrocarbyl groups having at least one carbon—carbon triple bond, and typically having in the range of about 2 up to 500 carbon atoms, and "substituted alkynyl" refers to alkynyl groups further bearing one or more substituents as set forth above.

As employed herein, "cycloalkyl" refers to a cyclic ring-containing groups containing in the range of about 3 up to about 50 carbon atoms, and "substituted cycloalkyl" refers to cycloalkyl groups further bearing one or more substituents as set forth above. Cycloalkyl groups include both mono- and polycyclic alkyl groups such as cyclopentyl, cyclohexyl, decalyl, bicycloheptyl, and the like.

As employed herein, "cycloalkenyl" refers to cyclic ring-containing groups containing in the range of 3 up to 50 carbon atoms and having at least one carbon—carbon double bond, and "substituted cycloalkenyl" refers to cycloalkenyl groups further bearing one or more substituents as set forth above. Cycloalkenyl groups include both mono- and polycyclic alkenyl groups such as cyclopentenyl, cyclopentadienyl, cyclohexenyl, bicycloheptenyl, tricyclodecenyl, and the like.

As employed herein, "aryl" refers to aromatic groups having in the range of 6 up to 14 carbon atoms and "substituted aryl" refers to aryl groups further bearing one or more substituents as set forth above.

As employed herein, "alkylaryl" refers to alkyl-substituted aryl groups and "substituted alkylaryl" refers to alkylaryl groups further bearing one or more substituents as set forth above.

As employed herein, "arylalkyl" refers to aryl-substituted alkyl groups and "substituted arylalkyl" refers to arylalkyl groups further bearing one or more substituents as set forth above.

As employed herein, "arylalkenyl" refers to aryl-substituted alkenyl groups and "substituted arylalkenyl" refers to arylalkenyl groups further bearing one or more substituents as set forth above.

As employed herein, "alkenylaryl" refers to alkenyl-substituted aryl groups and "substituted alkenylaryl" refers to alkenylaryl groups further bearing one or more substituents as set forth above.

As employed herein, "arylalkynyl" refers to aryl-substituted alkynyl groups and "substituted arylalkynyl" refers to arylalkynyl groups further bearing one or more substituents as set forth above.

As employed herein, "alkynylaryl" refers to alkynyl-substituted aryl groups and "substituted alkynylaryl" refers to alkynylaryl groups further bearing one or more substituents as set forth above.

As employed herein, "heterocyclic" refers to cyclic (i.e., ring-containing) groups containing one or more heteroatoms (e.g., N, O, S, or the like) as part of the ring structure, and having in the range of 3 up to 14 carbon atoms and "substituted heterocyclic" refers to heterocyclic groups further bearing one or more substituents as set forth above. Exemplary heterocyclic moieties include saturated rings, unsaturated rings, and aromatic heteroatom-containing ring systems, e.g., epoxy, tetrahydrofuran, oxazoline, oxazine, pyrrole, pyridine, furan, and the like.

As employed herein, "hydrocarbylene" refers to divalent straight or branched chain hydrocarbyl groups including alkylene groups, alkenylene groups, alkynylene groups, cycloalkylene groups, heterocycloalkylene groups, arylene groups, heteroarylene groups, alkylarylene groups, arylalkylene groups, arylalkenylene groups, arylalkynylene groups, alkenylarylene groups, alkynylarylene groups, and the like; and "substituted hydrocarbylene" refers to hydrocarbylene groups further bearing one or more substituents as set forth above.

As employed herein, "alkylene" refers to saturated, divalent straight or branched chain hydrocarbyl groups typically having in the range of about 2 up to about 500 carbon atoms, and "substituted alkylene" refers to alkylene groups further bearing one or more substituents as set forth above.

As employed herein, "alkenylene" refers to divalent straight or branched chain hydrocarbyl groups having at least one carbon—carbon double bond, and typically having in the range of about 2 up to 500 carbon atoms, and "substituted alkenylene" refers to alkenylene groups further bearing one or more substituents as set forth above.

As employed herein, "alkynylene" refers to divalent straight or branched chain hydrocarbyl groups having at least one carbon—carbon triple bond, and typically having in the range of about 2 up to 500 carbon atoms, and "substituted alkynylene" refers to alkynylene groups further bearing one or more substituents as set forth above.

As employed herein, "cycloalkylene" refers to divalent ring-containing groups containing in the range of about 3 up to about 50 carbon atoms, and "substituted cycloalkylene" refers to cycloalkylene groups further bearing one or more substituents as set forth above. Cycloalkylene groups include both mono- and polycyclic alkylene groups such as cyclopentylene, cyclohexylene, decalylene, bicycloheptylene, and the like As employed herein, "cycloalkenylene" refers to divalent ring-containing groups containing in the range of about 3 up to about 50 carbon atoms and having at least one carbon—carbon double bond, and "substituted cycloalkenylene" refers to cycloalkenylene groups further bearing one or more substituents as set forth above. Cycloalkenylene groups include both mono- and polycyclic alkenylene groups such as cyclopentenylene, cyclopentadienylene, cyclohexenylene, bicycloheptenylene and the like.

As employed herein, "heterocycloalkylene" refers to divalent cyclic (i.e., ring-containing) groups containing one or more heteroatoms (e.g., N, O, S, or the like) as part of the ring structure, and having in the range of 3 up to 14 carbon atoms and "substituted heterocycloalkylene" refers to heterocycloalkylene groups further bearing one or more substituents as set forth above.

As employed herein, "arylene" refers to divalent aromatic groups typically having in the range of 6 up to 14 carbon atoms and "substituted arylene" refers to arylene groups further bearing one or more substituents as set forth above.

As employed herein, "alkylarylene" refers to alkyl-substituted divalent aryl groups typically having in the range of about 7 up to 16 carbon atoms and "substituted alkylarylene" refers to alkylarylene groups further bearing one or more substituents as set forth above.

As employed herein, "arylalkylene" refers to aryl-substituted divalent alkyl groups typically having in the range of about 7 up to 16 carbon atoms and "substituted arylalkylene" refers to arylalkylene groups further bearing one or more substituents as set forth above.

As employed herein, "arylalkenylene" refers to aryl-substituted divalent alkenyl groups typically having in the range of about 8 up to 16 carbon atoms and "substituted arylalkenylene" refers to arylalkenylene groups further bearing one or more substituents as set forth above.

As employed herein, "arylalkynylene" refers to aryl-substituted divalent alkynyl groups typically having in the range of about 8 up to 16 carbon atoms and "substituted arylalkynylene" refers to arylalkynylene group further bearing one or more substituents as set forth above.

As employed herein, "alkenylarylene" refers to alkenyl-substituted divalent aryl groups typically having in the range of about 7 up to 16 carbon atoms and "substituted alkenylarylene" refers to alkenylarylene groups further bearing one or more substituents as set forth above.

As employed herein, "alkynylarylene" refers to alkynyl-substituted divalent aryl groups typically having in the range of about 7 up to 16 carbon atoms and "substituted alkynylarylene" refers to alkynylarylene groups further bearing one or more substituents as set forth above.

As employed herein, "heteroarylene" refers to divalent aromatic groups containing one or more heteroatoms (e.g., N, O, S or the like) as part of the aromatic ring, and typically having in the range of 3 up to 14 carbon atoms and "substituted heteroarylene" refers to heteroarylene groups further bearing one or more substituents as set forth above.

As employed herein, "polysiloxane-polyurethane block copolymers" refer to polymers containing both at least one polysiloxane (soft) block and at least one polyurethane (hard) block.

When one or more of the above described monovalent or polyvalent groups contain one or more of the above described linkers to form the "J" appendage of a maleimide, nadimide or itaconimide group, as readily recognized by those of skill in the art, a wide variety of organic chains can be produced, such as, for example, oxyalkyl, thioalkyl, aminoalkyl, carboxylalkyl, oxyalkenyl, thioalkenyl, aminoalkenyl, carboxyalkenyl, oxyalkynyl, thioalkynyl, aminoalkynyl, carboxyalkynyl, oxycycloalkyl, thiocycloalkyl, aminocycloalkyl, carboxycycloalkyl, oxycycloalkenyl, thiocycloalkenyl, aminocycloalkenyl, carboxycycloalkenyl, heterocyclic, oxyheterocyclic, thioheterocyclic, aminoheterocyclic, carboxyheterocyclic, oxyaryl, thioaryl, aminoaryl, carboxyaryl, heteroaryl, oxyheteroaryl, thioheteroaryl, aminoheteroaryl, carboxyheteroaryl, oxyalkylaryl, thioalkylaryl, aminoalkylaryl, carboxyalkylaryl, oxyarylalkyl, thioarylalkyl, aminoarylalkyl, carboxyarylalkyl, oxyarylalkenyl, thioarylalkenyl, aminoarylalkenyl, carboxyarylalkenyl, oxyalkenylaryl, thioalkenylaryl, aminoalkenylaryl, carboxyalkenylaryl, oxyarylalkynyl, thioarylalkynyl, aminoarylalkynyl, carboxyarylalkynyl, oxyalkynylaryl, thioalkynylaryl, aminoalkynylaryl or carboxyalkynylaryl, oxyalkylene, thioalkylene, aminoalkylene, carboxyalkylene, oxyalkenylene, thioalkenylene, aminoalkenylene, carboxyalkenylene, oxyalkynylene, thioalkynylene, aminoalkynylene, carboxyalkynylene, oxycycloalkylene, thiocycloalkylene, aminocycloalkylene, carboxycycloalkylene, oxycycloalkenylene, thiocycloalkenylene, aminocycloalkenylene, carboxycycloalkenylene, oxyarylene, thioarylene, aminoarylene, carboxyarylene, oxyalkylarylene, thioalkylarylene, aminoalkylarylene, carboxyalkylarylene, oxyarylalkylene, thioarylalkylene, aminoarylalkylene, carboxyarylalkylene, oxyarylalkenylene, thioarylalkenylene, aminoarylalkenylene, carboxyarylalkenylene, oxyalkenylarylene, thioalkenylarylene, aminoalkenylarylene, carboxyalkenylarylene, oxyarylalkynylene, thioarylalkynylene, aminoarylalkynylene, carboxy arylalkynylene, oxyalkynylarylene, thioalkynylarylene, aminoalkynylarylene, carboxyalkynylarylene, heteroarylene, oxyheteroarylene, thioheteroarylene, aminoheteroarylene, carboxyheteroarylene, heteroatom-containing di- or polyvalent cyclic moiety, oxyheteroatom-containing di- or polyvalent cyclic moiety, thioheteroatom-containing di- or polyvalent cyclic moiety, aminoheteroatom-containing di- or polyvalent cyclic moiety, carboxyheteroatom-containing di- or polyvalent cyclic moiety, and the like.

In another embodiment, maleimides, nadimides, and itaconimides contemplated for use in the practice of the present invention have the structures I, II, or III wherein:
m=1–6,
p=0–6, and
J is
(a) saturated straight chain alkyl or branched chain alkyl, optionally containing optionally substituted aryl moieties as substituents on the alkyl chain or as part of the backbone of the alkyl chain, and wherein the alkyl chains have up to about 20 carbon atoms;
(b) a siloxane having the structure: $-(C(R^3)_2)_d-[Si(R^4)_2-O]_f-Si(R^4)_2-(C(R^3)_2)_e-$, $-(C(R^3)_2)_d-C(R^3)-C(O)O-(C(R^3)_2)_d-[Si(R^4)_2-O]_f-Si(R^4)_2-(C(R^3)_2)_e-O(O)C-(C(R^3)_2)_e-$, or $-(C(R^3)_2)_d-C(R^3)-O(O)C-(C(R^3)_2)_d-[Si(R^4)_2-O]_f-Si(R^4)_2-(C(R^3)_2)_e-C(O)O-(C(R^3)_2)_e-$
wherein:
each $R^3$ is independently hydrogen, alkyl or substituted alkyl,
each $R^4$ is independently hydrogen, lower alkyl or aryl,
d=1–10,
e=1–10, and
f=1–50;
(c) a polyalkylene oxide having the structure:

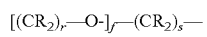

wherein:
each R is independently hydrogen, alkyl or substituted alkyl,
r=1–10,
s=1–10, and
f is as defined above;
(d) aromatic groups having the structure:

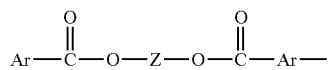

wherein each Ar is a monosubstituted, disubstituted or trisubstituted aromatic or heteroaromatic ring having in the range of 3 up to 10 carbon atoms, and Z is:
(i) saturated straight chain alkylene or branched chain alkylene, optionally containing saturated cyclic moieties as substituents on the alkylene chain or as part of the backbone of the alkylene chain, or
(ii) polyalkylene oxides having the structure:

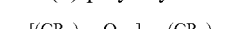

wherein each R is independently defined as above, r and s are each defined as above, and q falls in the range of 1 up to 50;
(e) di- or tri-substituted aromatic moieties having the structure:

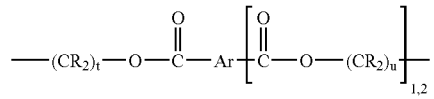

wherein each R is independently defined as above, t falls in the range of 2 up to 10, u falls in the range of 2 up to 10, and Ar is as defined above;
(f) aromatic groups having the structure:

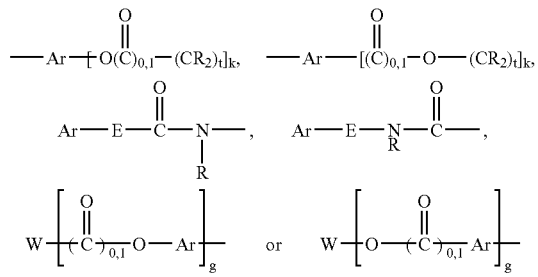

wherein:
each R is independently defined as above,
t=2–10,
k=1, 2 or 3,
g=1 up to about 50,
each Ar is as defined above,
E is $-O-$ or $-NR^5-$, wherein $R^5$ is hydrogen or lower alkyl; and
W is
(i) straight or branched chain alkyl, alkylene, oxyalkylene, alkenyl, alkenylene, oxyalkenylene, ester, or polyester,
(ii) a siloxane having the structure $-(C(R^3)_2)_d-[Si(R^4)_2-O]_f-Si(R^4)_2-(C(R^3)_2)_e-$, $(C(R^3)_2)_d-C(R^3)-C(O)O-(C(R^3)_2)_d-[Si(R^4)_2-O]_f-Si(R^4)_2-(C(R^3)_2)_e-O(O)C-(C(R^3)_2)_e-$ or $-(C(R^3)_2)_d-C(R^3)-O(O)C-(C(R^3)_2)_d-[Si(R^4)_2-O]_f-Si(R^4)_2-(C(R^3)_2)_e-C(O)O-(C(R^3)_2)_e-$ wherein,
each $R^3$ is independently hydrogen, alkyl or substituted alkyl,
each $R^4$ is independently hydrogen, lower alkyl or aryl,
d=1–10,
e=1–10, and
f=1–50; or
(iii) a polyalkylene oxide having the structure:

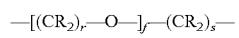

wherein:
each R is independently hydrogen, alkyl or substituted alkyl,
r=1–10,
s=1–10, and
f is as defined above;

optionally containing substituents selected from hydroxy, alkoxy, carboxy, nitrile, cycloalkyl or cycloalkenyl;

(g) a urethane group having the structure:

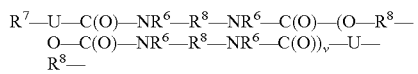

wherein:
  each $R^6$ is independently hydrogen or lower alkyl;
  each $R^7$ is independently an alkyl, aryl, or arylalkyl group having 1 to 18 carbon atoms;
  each $R^8$ is an alkyl or alkyloxy chain having up to about 100 atoms in the chain, optionally substituted with Ar;
  U is —O—, —S—, —N(R)—, or —P(L)$_{1,2}$— wherein R as defined above, and wherein each L is independently =O, =S, —OR or —R; and
  v=0–50;

(h) polycyclic alkenyl; or (i) mixtures of any two or more thereof.

In another embodiment, J is of sufficient length to render liquid the one or more maleimide, nadimide, or itaconimide. In some such embodiments, m=1, 2 or 3, and J is a branched chain alkyl, alkylene or alkylene oxide of sufficient length and branching to render liquid the one or more of maleimide, nadimide, or itaconimide. In still other embodiments of conductive inks of the present invention, J is 10,11-dioctyleicosylene.

Maleimides, nadimides, and itaconimides can be prepared employing techniques well known to those of skill in the art. For example, the most straightforward preparation of maleimides entails formation of the maleamic acid via reaction of the corresponding primary amine with maleic anhydride, followed by dehydrative closure of the maleamic acid with acetic anhydride. Similarly, anhydride precursors of nadimides or itaconimides may be reacted with suitable primary amines. The higher nadimides may be produced by Diels-Alder reactions of the J-substituted maleimide or maleic anhydride with cyclopentadienes and the like.

A potential drawback to the use of acetic anhydride to effect dehydrative ring closure is that some or all of the closure may yield the isomaleimide instead of the desired maleimide. Often, the isomaleimide is the dominant or even exclusive kinetic product, whereas the desired maleimide is the thermodynamic product. Conversion of the isomaleimide to the maleimide is effectively the slow step and, particularly in the case of aliphatic amides, may require forcing conditions which can lower the yield. Nevertheless, in the case of a stable backbone such as that provided by a long, branched chain hydrocarbon (e.g., —(CH$_2$)$_9$—CH (C$_8$H$_{17}$)—CH(C$_8$H$_{17}$)—(CH$_2$)$_9$), the simple acetic anhydride approach appears to be the most cost effective method. In addition, a variety of other approaches can also be employed, as can be readily identified by those of skill in the art.

For example, dicyclohexylcarbodiimide (DCC) closes maleamic acids much more readily than does acetic anhydride. With DCC, the product is exclusively isomaleimide. However, in the presence of suitable isomerizing agents, such as 1-hydroxybenzotriazole (HOBt), the product is solely the maleimide. Thus, it has been found that the isoamide generated by reaction of, e.g., the bismaleamic acid of 10,11-dioctyleicosane with either acetic anhydride or EEDQ (2-ethoxy-1-ethoxycarbonyl-1,2-dihydroquinoline) is isomerized to the bismaleimide by catalytic amounts of HOBt. 3-Hydroxy-1,2,3-benzotriazine-4-one appears to be at least as effective as HOBt in effecting this isomerization, whereas N-hydroxysuccinimide is substantially less so.

One challenge encountered in the preparation of maleimides, nadimides and itaconimides is their proclivity for oligomerization. During synthesis of these compounds, radical inhibitors may be used to mitigate this potential problem. Alternatively, any oligomer formed may be removed by extracting the product into pentane, hexane or petroleum ether, in which the oligomers are essentially insoluble.

Comonomers contemplated for use in the practice of the present invention include (meth)acrylate, epoxy, vinyl ether, vinyl ester, vinyl ketone, vinyl aromatic, vinyl cycloalkyl, allyl amide, and combinations of any two or more thereof. Suitable combinations include but are not limited to (meth)acrylate/vinyl ether and (meth)acrylate/epoxy.

Exemplary (meth)acrylates contemplated for use in the practice of the present invention may be prepared from a host of different compounds. As used herein, the terms (meth)acrylic and (meth)acrylate are used synonymously with regard to the monomer and monomer-containing component. The terms (meth)acrylic and (meth)acrylate include acrylic, methacrylic, acrylate and methacrylate. The (meth)acrylates may comprise one or more members selected from a monomer including:

(a) the structure represented by the formula:

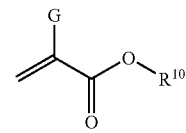

wherein:
  G is hydrogen, halogen, or an alkyl having from 1 to 4 carbon atoms,
  $R^{10}$ has from 1 to 16 carbon atoms and is an alkyl, cycloalkyl, alkenyl, cycloalkenyl, alkaryl, aralkyl, or aryl group, optionally substituted or interrupted with silane, silicon, oxygen, halogen, carbonyl, hydroxyl, ester, carboxylic acid, urea, urethane, carbamate, amine, amide, sulfur, sulfonate, or sulfone;

(b) urethane acrylates or ureide acrylates represented by the formula:

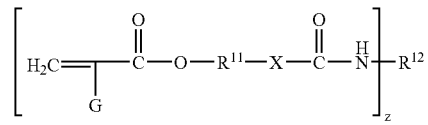

wherein:
  G is hydrogen, halogen, or an alkyl having from 1 to 4 carbon atoms;
  $R^{11}$ is a divalent alkyl, cycloalkyl, aromatic, or arylalkyl group;
  X is —O—, —NH—, or —N(alkyl)-, in which the alkyl radical has from 1 to 8 carbon atoms;
  z is 2 to 6; and
  $R^{12}$ is a z-valent cycloalkyl, aromatic, or arylalkyl group;

(c) a di- or tri-(meth)acrylate selected from polyethylene glycol di(meth)acrylates, bisphenol-A di(meth)acrylates, tetrahydrofuran di(meth)acrylates, hexanediol di(meth)acrylate, trimethylol propane tri(meth)acrylate, and the like, as well as combinations of any two or more thereof; or (d) cyclic acrylates having the structure:

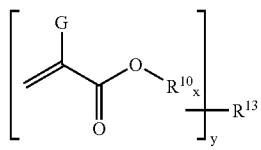

wherein
x=0, 1,
G and $R^{10}$ are as described above; and
$R^{13}$ is an optionally substituted y-valent cycloalkyl or cycloalkene group having from 5 to 50 carbons, wherein $R^{13}$ is covalently bound in place of any hydrogen on the double bond or $R^{10}$, when present, or on the oxygen when $R^{10}$ is absent.

Suitable polymerizable (meth)acrylate monomers include cyclic acrylates as described in U.S. Pat. Nos. 6,121,358 and 6,322,620, each of which is hereby incorporated by reference in its entirety.

Suitable polymerizable (meth)acrylate monomers include triethylene glycol dimethacrylate, tripropylene glycol diacrylate, tetraethylene glycol dimethacrylate, diethylene glycol dimethacrylate, 1,4-butanediol diacrylate, 1,6-hexanediol dimethacrylate, pentaerythritol tetraacrylate, trimethylol propane triacrylate, trimethylol propane trimethacrylate, di-pentaerythritol monohydroxypentaacrylate, pentaerythritol triacrylate, bisphenol-A-ethoxylate dimethacrylate, trimethylolpropane ethoxylate triacrylate, trimethylolpropane propoxylate triacrylate, bisphenol-A-diepoxide dimethacrylate, and the like, as well as combinations of any two or more thereof.

Additionally, (meth)acrylate monomers contemplated for use herein include polyethylene glycol di(meth)acrylates, bisphenol-A di(meth)acrylates, tetrahydrofuran (meth)acrylates and di(meth)acrylates, citronellyl acrylate and citronellyl methacrylate, hydroxypropyl (meth)acrylate, hexanediol di(meth)acrylate, trimethylol propane tri(meth)acrylate, tetrahydrodicyclopentadienyl (meth)acrylate, ethoxylated trimethylol propane triacrylate, triethylene glycol acrylate, triethylene glycol methacrylate, and the like, as well as combinations of any two or more thereof.

In some embodiments, the comonomer comprises epoxy such as a solid or liquid epoxy resin derived from bisphenol-A and epichlorohydrin. The epoxy resin has an average of 1 to 11 hydroxyl groups per molecule plus the terminal epoxy groups. One exemplary resin which may be employed in the conductive ink is an epoxy resin such as Epon 1007 (Shell Corporation).

Vinyl ethers, ketones, and esters contemplated for use in the practice of the invention include those having the general formula:

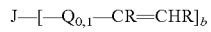

wherein:
each Q is independently selected from —O—, —C(O)— or —C(O)—O—;
each R is independently selected from hydrogen or lower alkyl;
b=1, 2 or 3; and
J is
(a) saturated straight chain alkyl or branched chain alkyl, optionally containing optionally substituted aryl moieties as substituents on the alkyl chain or as part of the backbone of the alkyl chain, and wherein the alkyl chains have up to about 20 carbon atoms;

(b) a siloxane having the structure: —$(C(R^3)_2)_d$—[Si$(R^4)_2$—O]$_f$—Si$(R^4)_2$—$(C(R^3)_2)_e$—, —$(C(R^3)_2)_d$—C$(R^3)$—C(O)O—$(C(R^3)_2)_d$—[Si$(R^4)_2$—O]$_f$—Si$(R^4)_2$—$(C(R^3)_2)_e$—O(O)C—$(C(R^3)_2)_e$—, or —$(C(R^3)_2)_d$—C$(R^3)$—O(O)C—$(C(R^3)_2)_d$—[Si$(R^4)_2$—O]$_f$—Si$(R^4)_2$—$(C(R^3)_2)_e$—C(O)O—$(C(R^3)_2)_e$— wherein:
each $R^3$ is independently hydrogen, alkyl or substituted alkyl,
each $R^4$ is independently hydrogen, lower alkyl or aryl,
d=1–10,
e=1–10, and
f=1–50;

(c) a polyalkylene oxide having the structure:

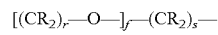

wherein:
each R is independently hydrogen, alkyl or substituted alkyl,
r=1–10,
s 1–10, and
f is as defined above;

(d) aromatic groups having the structure:

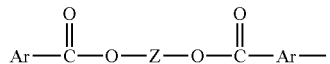

wherein each Ar is a monosubstituted, disubstituted or trisubstituted aromatic or heteroaromatic ring having in the range of 3 up to 10 carbon atoms, and Z is:
(i) saturated straight chain alkylene or branched chain alkylene, optionally containing saturated cyclic moieties as substituents on the alkylene chain or as part of the backbone of the alkylene chain, or
(ii) polyalkylene oxides having the structure:

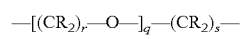

wherein each R is independently defined as above, r and s are each defined as above, and q falls in the range of 1 up to 50;

(e) di- or tri-substituted aromatic moieties having the structure:

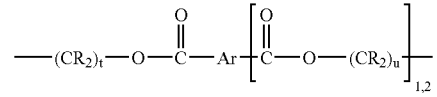

wherein each R is independently defined as above, t falls in the range of 2 up to 10, u falls in the range of 2 up to 10, and Ar is as defined above;

(f) aromatic groups having the structure:

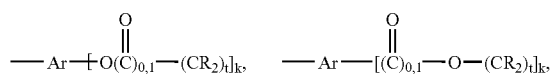

-continued

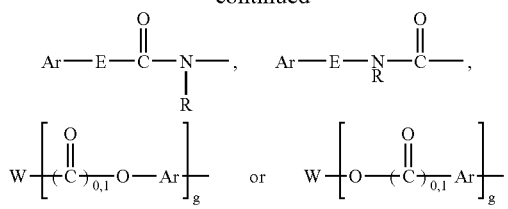

wherein:
each R is independently defined as above,
t=2–10,
k=1, 2 or 3,
g=1 up to about 50,
each Ar is as defined above,
E is —O— or —NR$^5$—, wherein R$^5$ is hydrogen or lower alkyl; and
W is
(i) straight or branched chain alkyl, alkylene, oxyalkylene, alkenyl, alkenylene, oxyalkenylene, ester, or polyester,
(ii) a siloxane having the structure —(C(R$^3$)$_2$)$_d$—[Si(R$^4$)$_2$—O]$_f$—Si(R$^4$)$_2$—(C(R$^3$)$_2$)$_e$—, —(C(R$^3$)$_2$)$_d$—C(R$^3$)—C(O)O—(C(R$^3$)$_2$)$_d$—[Si(R$^4$)$_2$—O]$_f$—Si(R$^4$)$_2$—(C(R$^3$)$_2$)$_e$—O(O)C—(C(R$^3$)$_2$)$_e$—, or —(C(R$^3$)$_2$)$_d$—C(R$^3$)—O(O)C—(C(R$^3$)$_2$)$_d$—[Si(R$^4$)$_2$—O]$_f$—Si(R$^4$)$_2$—(C(R$^3$)$_2$)$_e$—C(O)O—(C(R$^3$)$_2$)$_e$— wherein,
each R$^3$ is independently hydrogen, alkyl or substituted alkyl,
each R$^4$ is independently hydrogen, lower alkyl or aryl,
d=1–10,
e=1–10, and
f=1–50; or
(iii) a polyalkylene oxide having the structure:

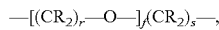

wherein:
each R is independently hydrogen, alkyl or substituted alkyl,
r=1–10,
s 1–10, and
f is as defined above;
optionally containing substituents selected from hydroxy, alkoxy, carboxy, nitrile, cycloalkyl or cycloalkenyl;
(g) a urethane group having the structure:

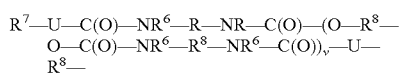

wherein:
each R$^6$ is independently hydrogen or lower alkyl;
each R$^7$ is independently an alkyl, aryl, or arylalkyl group having 1 to 18 carbon atoms;
each R$^8$ is an alkyl or alkyloxy chain having up to about 100 atoms in the chain, optionally substituted with Ar;
U is —O—, —S—, —N(R)—, or —P(L)$_{1,2}$— wherein R as defined above, and wherein each L is independently =O, =S, —OR or —R; and
v=0–50;
(h) polycyclic alkenyl; or
(i) mixtures of any two or more thereof.

Exemplary vinyl or polyvinyl compounds embraced by the above generic structure include stearyl vinyl ether, behenyl vinyl ether, eicosyl vinyl ether, isoeicosyl vinyl ether, isotetracosyl vinyl ether, poly(tetrahydrofuran) divinyl ether, tetraethylene glycol divinyl ether, tris-2,4,6-(1-vinyloxybutane-4-)oxy-1,3,5-triazine, bis-1,3-(1-vinyloxybutane-4-)oxycarbonyl-benzene (alternately referred to as bis(4-vinyloxybutyl)isophthalate; available from Allied-Signal Inc., Morristown, N.J., under the trade name Vectomer θ4010), divinyl ethers prepared by transvinylation between lower vinyl ethers and higher molecular weight di-alcohols (e.g., α,ω-dihydroxy hydrocarbons prepared from dimer acids; an exemplary divinyl ether which can be prepared from such dimer alcohols is 10,11-dioctyl eicosane-1,20-divinyl ether, which would likely exist in admixture with other isomeric species produced in ene reactions employed to produce dimer acids), in the presence of a suitable palladium catalyst (see, for example, U.S. Pat. No. 6,034,195, herein incorporated by reference in its entirety), optionally hydrogenated α,ω-disubstituted polybutadienes, optionally hydrogenated α,ω-disubstituted polyisoprenes, optionally hydrogenated α,ω-disubstituted poly [(1-ethyl)-1,2-ethane], and the like. Preferred divinyl resins include stearyl vinyl ether, behenyl vinyl ether, eicosyl vinyl ether, isoeicosyl vinyl ether, poly (tetrahydrofuran) divinyl ether, divinyl ethers prepared by transvinylation between lower vinyl ethers and higher molecular weight di-alcohols (e.g., α,ω-dihydroxy hydrocarbons prepared from dimer acids, as described above; an exemplary divinyl ether which can be prepared from such dimer alcohols is 10,11-dioctyl eicosane-1,20-divinyl ether, which would likely exist in admixture with other isomeric species produced in ene reactions employed to produce dimer acids), in the presence of a suitable palladium catalyst (see, for example, U.S. Pat. No. 6,034,195, herein incorporated by reference in its entirety), and the like.

Allyl amides suitable for use in the present invention include compounds having the formula

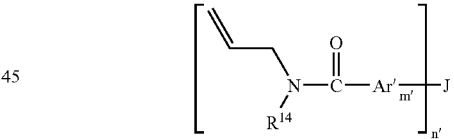

in which
m' is 0 or 1;
n' is 1 to 6; and
R$^{14}$ is H, an alkyl group having 1 to 18 carbon atoms, an alkyleneoxy group having 1 to 18 carbon atoms, aryl, or substituted aryl having the structure

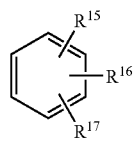

in which R$^{15}$, R$^{16}$ and R$^{17}$ are independently H or an alkyl or alkyleneoxy group having 1 to 18 carbon atoms;

Ar' is an aromatic group having the following structure:

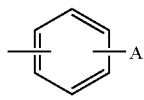

where A is —O—, —C(O)—, —O—C(O)—, —C(O)—NH—, or —O—C(O)—NH—; and

J is as defined above.

Exemplary allyl amides include those described in U.S. Pat. No. 6,350,841, herein incorporated by reference in its entirety.

Catalysts contemplated for use in the practice of the present invention include free-radical initiators such as peroxides, azo compounds, or combinations of any two or more thereof. Exemplary free-radical initiators include peroxy esters, peroxy carbonates, hydroperoxides, alkylperoxides, arylperoxides, azo compounds, and the like. In some such embodiments, the free radical initiator is dicumyl peroxide, dibenzoyl peroxide, 2-butanone peroxide, tert-butyl perbenzoate, di-tert-butyl peroxide, 2,5-bis(tert-butylperoxy)-2,5-dimethylhexane, bis(tert-butyl peroxyisopropyl) benzene, tert-butyl hydroperoxide, or mixture of any two or more thereof. In one embodiment, the catalyst is present in the range of about 0.2 up to about 5 weight percent based on the total weight of the composition.

The particulated electrically conductive material employed in the practice of the present invention may be selected from silver, copper, silver-coated copper, gold-coated copper, silver-coated aluminum, gold-coated aluminum, coated mica, glass spheres, and the like, as well as mixtures of any two or more thereof.

Organic solvents, when present, are utilized to substantially dissolve the resin system and to adjust the viscosity of the inks in order to make the ink best suited to form conductive circuitry on substrates with through hole connections. Solvents which may be utilized include hydrocarbons, ethers, alcohols, esters, ketones, and the like, as well as combinations of any two or more thereof. Exemplary solvents include amyl acetate, ethyl 3-ethoxypropionate (EEP, Eastman), diethyl glycol, monoethyl ether, diethylene glycol dimethylene ether, dibasic ester solvent, carbitol, carbitol acetate, butyl carbitol, butyl carbitol acetate, acetone, methyl ethyl ketone, cyclohexanone, diethylene glycol monoethyl ether acetate, diethylene glycol monobutyl ether acetate, dipropylene glycol monomethyl ether, dipropylene glycol dimethyl ether, and the like. In some such embodiments, the solvent is an ester such as amyl acetate.

Suitable flow additives, adhesion promoters, electrical enhancers, and rheology modifiers and mixtures of any two or more thereof may be added to the compositions of the present invention as desired. Optional flow additives include silicon polymers, ethyl acrylate/2-ethylhexyl acrylate copolymers, alkylol ammonium salt of phosphoric acid esters of ketoxime, and the like, as well as combinations of any two or more thereof. Suitable electrical enhancers include polar, ionic, and metal-containing compounds such as hydroquinone, Vitamin E, metallic dryers, metallic acrylates, titanates, phosphoric acid, and other acid catalysts.

Suitable adhesion promoters include various forms of silane, including mercaptosilanes and those with a curable functional group. Mercaptosilanes are useful because they provide especially enhanced adhesion on copper substrates. Silanes with curable functional groups include those with a carbon—carbon double bond or an epoxy group, e.g., glycidyl trimethoxysilane (commercially available from OSI under the trade designation A-187). In addition, aminosilanes such as gamma-amino propyl triethoxysilane (commercially available from OSI under the trade designation A-1100) and trialkoxysilyl isocyanurate derivatives (e.g., Y-11597 from OSI) may also be used.

Suitable rheology modifiers include thermoplastic resins such as polystyrene-polybutadiene copolymer, poly(methyl methacrylate), poly(ethyl methacrylate), and polyvinyl acetal and thixotropes such as THIXATROL compounds. The latter include hydroxy or amine modified aliphatic hydrocarbons such as THIXCIN R, THIXCIN GR, THIXATROL ST and THIXATROL GST, available from Rheox Inc., Hightstown, N.J. These modified aliphatic hydrocarbons are castor oil based materials. The hydroxyl modified aliphatic hydrocarbons are partially dehydrated castor oil or partially dehydrated glycerides of 12-hydroxystearic acid. These hydrocarbons may be further modified with polyamides to form other rheology modifiers such as polyamides of hydroxy stearic acid. Desirably, the hydroxy or amine modified aliphatic hydrocarbon is THIXCIN R.

Liquid polyester-amide based rheolgical modifiers include THIXATROL TSR, THIXATROL SR and THIXATROL VF, available from Rheox Inc., Hightstown, N.J. These rheological modifiers are described to be reaction products, polycarboxylic acids, polyamines, alkoxylated polyols and capping agents. Useful polycarboxylic acids include sebacic acid, poly(butadiene)dioic acids, dodecane dicarboxylic acids, and the like. Suitable polyamines include diamine alkyls. Capping agents include monocarboxylic acids having aliphatic unsaturation.

The present invention provides methods of using an invention ink comprising applying such a conductive ink to a substrate such as a dielectric material, a capacitor component, a printed wiring board, and the like. Suitable printed wiring boards include an epoxy glass-type printed wiring board or a phenolic-type printed wiring board. The ink is applied to the substrate by suitable means, such as dipping or screen printing. Thus, in accordance with the present invention, there are also provided articles comprising substrates containing a cured aliquot of an invention ink including, but not limited to, printed wiring boards and capacitors.

The invention can be further described by reference to the following non-limiting examples.

EXAMPLE 1

A conductive ink dispersion was formed by first dissolving the film forming agent, such as polystyrene-polybutadiene copolymer or poly(methyl methacrylate), in amyl acetate. The maleimide, acrylates, silane, initiator and inhibitors were added to the solution. Silver fillers were subsequently added with agitation. The ink dispersion was agitated on jar roller for at least 30 minutes prior to being used for preparing test specimens. Table 1 shows the various compositions (A–K) of ink produced and tested.

A. Volume Resistivity. The volume resistivity (VR) of the cured material was measured by a standard strip method. Each specimen for the strip electrical conductive test was prepared by first coating a thin layer onto a glass slide masked with tape. The ink layer was dried at ambient temperature and subsequently cured for 1 hour at 165° C. The resistivity was measured with a four-probe ohm meter, and the volume resistivities were calculated from the equation: $VR=(M)(T)(W_i)/D$, wherein M is the measured resistivity in mOhms, T is the thickness of the strip in centimeters (cm), $W_i$ is the width of the strip in cm, and D is the distance between the probes (cm).

The data from compositions A to F in Table 1 show that as the silver loading increases, the volume resistivity decreases. At 87% loading for this particular system, the volume resistivity reached the lowest point. Further increases in silver loading did not improve the electrical conductivity. As shown by compositions I and J, the addition of metal acrylates improved the electrical conductivity of the ink. Thus, invention compositions have comparable electrical conductivity performance to prior art compositions.

B. Shear Strength: The shear strength of the cured ink was tested on a 300×300×14 mil silicon die on a glass slide. The ink dispersion was coated on a surface of the die and a surface of the glass slide and dried. Subsequently, the coated surfaces of the die and glass slide were brought into contact with each other at 90° C. under pressure, to obtain a uniformly thick bond line. The assembly was cured for 1 hour at 165° C. The die shear was measured using a Dage 2400PC or Dage 4000. Table 1 shows the excellent shear strength of invention compositions.

C. Shelf Life. An ink formulation similar to H but loaded with 83% Ag fillers was kept at 35° C. for six months and showed no sign of polymerization, indicating that the inks in Table 1 have a shelf life at room temperature of longer than six months.

What is claimed is:

1. A conductive ink comprising:
   (a) in the range of about 1 to 20 weight percent of a thermally curable resin system comprising
      (i) one or more of a maleimide, nadimide, or itaconimide,
      (ii) a comonomer, wherein the comonomer comprises a (meth)acrylate, epoxy, vinyl ether, vinyl ester, vinyl ketone, vinyl aromatic, vinyl cycloalky, allyl amide, or combination of any two or more thereof, and
      (iii) a catalyst;
         wherein the weight ratio of the one or more maleimide, nadimide, itaconimide, or combination/comonomer/catalyst in the resin system falls in the range of about 2–100/4–200/1;
   (b) in the range of about 40 to 90 weight percent of a particulated electrically conductive material;
   (c) in the range of 0 to about 50 weight percent of an organic solvent; and
   (d) in the range of about 0.5 to 10 weight percent of at least one additional component selected from the group consisting of flow additives, adhesion promoters, rheology modifiers, electrical enhancers, stabilizer and mixtures of any two or more thereof;
   wherein weight percent is based on the total of components (a), (b), (c), and (d).

2. The conductive ink of claim 1, wherein the one or more maleimide, nadimide, or itaconimide comprise, respectively, the structures I, II, and III:

TABLE 1

| Materials | A | B | C | D | E | F | G | H | I | J | K |
| --- | --- | --- | --- | --- | --- | --- | --- | --- | --- | --- | --- |
| Kraton D1102 (poly(styrene)-butadiene)) | 4.51% | 3.80% | 3.57% | 3.28% | 2.99% | 2.71% | 3.76% | 3.64% | 3.63% | 3.4% | |
| Amyl Acetate | 38.93% | 39.75% | 41.23% | 41.95% | 42.66% | 43.36% | 32.76% | 34.73% | 34.69% | 38.71% | 33.63% |
| CM1016 (X-bismaleimide I)[1] | 5.31% | 4.51% | 4.14% | 3.78% | 3.43% | 3.09% | 3.08% | 4.87% | 4.88% | 4.19% | 5.61% |
| RE0524 (maleated polybutadiene) | 0.41% | 0.35% | 0.32% | 0.30% | 0.27% | 0.25% | 0.53% | 0.33% | 0.33% | 0.31% | 0.34% |
| SR339 (2-Phenoxyethyl acrylate) | 1.11% | 0.93% | 0.88% | 0.80% | 0.73% | 0.66% | 1.44% | 0.89% | 0.89% | 0.83% | 0.91% |
| Polycyclic aliphatic acrylate[2] | 1.48% | 1.24% | 1.17% | 1.07% | 0.98% | 0.89% | 1.94% | 1.19% | 1.19% | 1.11% | 1.21% |
| A027 (silane coupling agent) | 0.25% | 2.07% | 0.19% | 0.18% | 0.16% | 0.15% | 0.32% | 0.20% | 0.20% | 0.19% | 0.20% |
| A026 (free radical initiator) | 0.25% | 0.21% | 0.19% | 0.18% | 0.16% | 0.15% | 0.32% | 0.20% | 0.20% | 0.19% | 0.20% |
| 2,6-Di-tert-butyl-4-methylphenol (stabilizer)[3] | | | | | | | | 0.0057% | 0.0057% | 0.0052% | 0.0057% |
| 2,5-Dichloro-1,4-benzoquinone (stabilizer)[3] | | | | | | | | 0.0139% | 0.0139% | 0.0130% | 0.0141% |
| Metal acrylate (electrical enhancer #1)[4] | | | | | | | | | | 0.19% | |
| Metal acrylate (electrical enhancer #2)[5] | | | | | | | | | 0.10% | | |
| Elvacite 2042 (polyethyl methacrylate) | | | | | | | | | | | 1.1% |
| Ag filler | 50.61% | 49.57% | 50.49% | 50.45% | 50.41% | 50.37% | 58.78% | 56.82% | 56.76% | 53.20% | 57.18% |
| Ag % in dry film | 82.9% | 82.3% | 85.9% | 86.9% | 87.9% | 88.9% | 87.1% | 87.0% | 86.9% | 86.8% | 87.0% |
| Test Results | | | | | | | | | | | |
| Volume resistivity, mOhm-cm (2 layer) | 5 | | | 0.67 | | | 0.213 | 0.069 | 0.045 | 0.033 | 0.06 |
| Volume resistivity, mOhm-cm (1 layer) | Open | Open | 7.8 | 2.3 | 2.2 | 3.8 | | | | | |
| RT die shear strength, 300 mil die (kg-force) | 43 | 30 | 20 | 25 | 13 | 15 | | | | | |
| 245° C. die shear strength, 300 mil die (kg-force) | 13 | 11 | 13 | 10 | 10 | 8 | | | | | |

[1]Described in U.S. Pat. Nos. 6,034,194 and 6,034,195.
[2]Described in U.S. Pat. No. 6,211,320, herein incorporated by reference in its entirety.
[3]Aldrich.
[4]Loctite
[5]Sartomer $$\left[ \begin{array}{c} \text{maleimide structure with J-N, two C=O, and } R^2 \end{array} \right]_m \quad \text{I}$$

$$\left[ \begin{array}{c} \text{norbornene-based bis-imide structure with J-N} \end{array} \right]_m \quad \text{II}$$

$$\left[ \begin{array}{c} \text{succinimide with exo-methylene, J-N} \end{array} \right]_m \quad \text{III}$$

wherein:
 m=1–15,
 p=0–15,
 each $R^2$ is independently selected from hydrogen or lower alkyl, and
 J is a monovalent or a polyvalent moiety comprising organic or organosiloxane radicals, and combinations thereof.

3. The conductive ink of claim 2, wherein:
J is a monovalent or polyvalent radical selected from the group consisting of hydrocarbyl, substituted hydrocarbyl, heteroatom-containing hydrocarbyl, substituted heteroatom-containing hydrocarbyl, hydrocarbylene, substituted hydrocarbylene, heteroatom-containing hydrocarbylene, substituted heteroatom-containing hydrocarbylene, polysiloxane, polysiloxane-polyurethane block copolymer, and combinations of two or more thereof, optionally containing one or more linkers selected from the group consisting of a covalent bond, —O—, —S—, —NR—, —O—C(O)—, —O—C(O)—O—, —O—C(O)—NR—, —NR—C(O)—, —NR—C(O)—O—, —NR—C(O)—NR—, —S—C(O)—, —S—C(O)—O—, —S—C(O)—NR—, —S(O)—, —S(O)$_2$—, —O—S(O)$_2$—, —O—S(O)$_2$—O—, —O—S(O)$_2$NR—, —O—S(O)—, —O—S(O)—O—, —O—S(O)—NR—, —O—NR—C(O)—, —O—NR—C(O)—, —O—NR—C(O)—NR—, —NR—O—C(O)—, —NR—O—C(O)—O—, —NR—O—C(O)—NR—, —O—NR—C(S)—, —O—NR—C(S)—O—, —O—NR—C(S)—NR—, —NR—O—C(S)—, —NR—O—C(S)—O—, —NR—O—C(S)—NR—, —O—C(S)—, —O—C(S)—O—, —O—C(S)—NR—, —NR—C(S)—, —NR—C(S)—O—, —NR—C(S)—NR—, —S—S(O)$_2$—, —S—S(O)$_2$—O—, —S—S(O)$_2$—NR—, —NR—O—S(O)—, —NR—O—S(O)—O—, —NR—O—S(O)—NR—, —NR—O—S(O)$_2$—, —NR—O—S(O)$_2$—O—, —NR—O—S(O)$_2$—NR—, —O—NR—S(O)—, —O—NR—S(O)—O—, —O—NR—S(O)—NR—, —O—NR—S(O)$_2$—O—, —O—NR—S(O)$_2$—NR—, —O—NR—S(O)$_2$—, —O—P(O)R$_2$—, —S—P(O)R$_2$—, —NR—P(O)R$_2$—,
wherein each R is independently hydrogen, alkyl or substituted alkyl, and combinations of any two or more thereof.

4. The conductive ink of claim 2, wherein:
m=1–6,
p=0–6, and
J is
(a) saturated straight chain alkyl or branched chain alkyl, optionally containing substituents selected from hydroxy, alkoxy, carboxy, nitrile, cycloalkyl cycloalkenyl, or optionally substituted aryl moieties as substituents on the alkyl chain or as part of the backbone of the alkyl chain, and wherein the alkyl chains have up to about 20 carbon atoms;
(b) alkylene, oxyalkylene, alkenyl, alkenylene, oxyalkenylene, ester, or polyester, optionally containing substituents selected from hydroxy, alkoxy, carboxy, nitrile, cycloalkyl or cycloalkenyl;
(c) a siloxane having the structure —(C(R$^3$)$_2$)$_d$—[Si(R$^4$)$_2$—O]$_f$—Si(R$^4$)$_2$—(C(R$^3$)$_2$)$_e$—, —(C(R$^3$)$_2$)$_d$—C(R$^3$)—C(O)O—(C(R$^3$)$_2$)$_d$—[Si(R$^4$)$_2$—O]$_f$—Si(R$^4$)$_2$—(C(R$^3$)$_2$)$_e$—, or —(C(R$^3$)$_2$)$_d$—C(R$^3$)—O(O)C—(C(R$^3$)$_2$)$_d$—[Si(R$^4$)$_2$—O]$_f$—Si(R$^4$)$_2$)$_6$—C(O)O—(C(R$^3$)$_2$)$_e$—
wherein:
each $R^3$ is independently hydrogen, alkyl or substituted alkyl,
each $R^4$ is independently hydrogen, lower alkyl or aryl,
d=1–10,
e=1–10, and
f=1–50;
(d) a polyalkylene oxide having the structure:

$$\text{—[(CR}_2\text{)}_r\text{—O—]}_f\text{—(CR}_2\text{)}_s\text{—}$$

wherein:
each R is independently hydrogen, alkyl or substituted alkyl,
r=1–10,
s=1–10, and
f is as defined above;
(e) aromatic groups having the structure:

$$\text{Ar}-\overset{\overset{\displaystyle O}{\|}}{C}-O-Z-O-\overset{\overset{\displaystyle O}{\|}}{C}-\text{Ar}-$$

wherein each Ar is a monosubstituted disubstituted or trisubstituted aromatic or heteroaromatic ring having in the range of 3 up to 10 carbon atoms, and Z is:
(i) saturated straight chain alkylene or branched chain alkylene, optionally containing saturated cyclic moieties as substituents on the alkylene chain or as part of the backbone of the alkylene chain, or
(ii) polyalkylene oxides having the structure:

$$\text{—[(CR}_2\text{)}_r\text{—O—]}_q\text{—(CR}_2\text{)}_s\text{—}$$

wherein:
each R is independently defined as above,
r=1–10,
s=1–10, and
q=1–50;
(f) di- or tri-substituted aromatic moieties having the structure:

$$\text{(CR}_2\text{)}_r\text{—O—(C=O)—Ar—[(C=O)—O—(CR}_2\text{)}_d\text{]}_{1,2}\text{—}$$

wherein:
    each R is independently defined as above,
    t=2–10,
    a=2–10, and
    Ar is as defined above;
(g) aromatic groups having the structure:

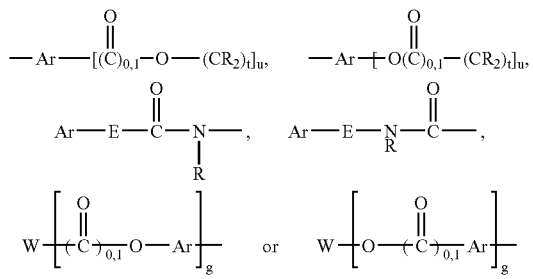

wherein:
    t=2–10,
    u=1, 2 or 3,
    g=1 up to about 50,
    each R is independently defined as above,
    each Ar is as defined above,
    E is —O— or —NR$^5$—, wherein R$^5$ is hydrogen or lower alkyl; and
    W is
        (i) straight or branched chain alkyl, alkylene, oxyalkylene, alkenyl, alkenylene, oxyalkenylene, ester, or polyester, optionally containing substituents selected from hydroxy, alkoxy, carboxy, nitrile, cycloalkyl or cycloalkenyl,
        (ii) a siloxane having the structure —(C(R$^3$)$_2$)$_d$—[Si(R$^4$)$_2$—O]$_f$—Si(R$^4$)$_2$—(C(R$^3$)$_2$)$_e$—,
            —(C(R$^3$)$_2$)$_d$— C(R$^3$)—C(O)O—(C(R$^3$)$_2$)$_d$—[Si(R$^4$)$_2$—O]$_f$Si(R$^4$)$_2$—(C(R$^3$)$_2$)$_e$—O(O)C—(C(R$^3$)$_e$—, or —(C(R$^3$)$_2$)$_d$—C(R$^3$)—O(O)C—(C(R$^3$)$_2$)$_d$—[Si(R$^4$)$_2$—O]$_f$—Si(R$^4$)$_2$—C(R$^3$)$_2$)$_e$—C(O)O—(C(R$^3$)$_2$)$_e$— wherein,
            each R$^3$ is independently hydrogen, alkyl or substituted alkyl,
            each R$^4$ is independently hydrogen, lower alkyl or
            d=1–10,
            e=1–10, and
            f=1–50; or
        (iii) a polyalkylene oxide having the structure:

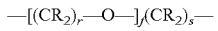

wherein;
            each R is independently defined as above,
            r=1–10,
            s=1–10, and
            f is defined as above;
        optionally containing substituents selected from hydroxy, alkoxy, carboxy, nitrile, cycloalkyl or cycloalkenyl;
(h) a urethane group having the structure:

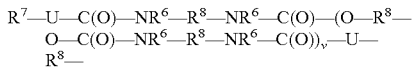

wherein:
    each R$^6$ is independently hydrogen or lower alkyl;
    each R$^7$ is independently an alkyl, aryl, or arylalkyl group having 1 to 18 carbon atoms;
    each R$^8$ is an alkyl or alkyloxy chain having up to about 100 atoms in the chain, optionally substituted with Ar;
    U is —O—, —S—, —N(R)—, or —P(L)$_{1,2}$— wherein R as defined above, and wherein each L is independently =O, =S, —OR or —R; and
    v=0–50;
(i) polycyclic alkenyl; or
(j) mixtures of any two or more thereof.

5. The conductive ink of claim 4, wherein J is of sufficient length to render liquid the one or more maleimide, nadimide, or itaconamide, at ambient temperature.

6. The conductive ink of claim 4, wherein
    m=1, 2, or 3, and
    J is of sufficient length and branching to render liquid the one or more maleimide, nadimide, or itaconamide, at ambient temperature.

7. The conductive ink of claim 4 wherein J of the one or more maleimide, nadimide, or itaconamide is 10,11-dioctyl-eicosylene.

8. The conductive ink of claim 1, wherein the comonomer comprises an epoxy.

9. The conductive ink of claim 1, wherein the comonomer comprises a (meth)acrylate.

10. The conductive ink of claim 1, wherein the comonomer comprises a vinyl ether.

11. The conductive ink of claim 1, wherein the comonomer comprises a (meth)acrylate and vinyl ether.

12. The conductive ink of claim 1, wherein the comonomer comprises a (meth)acrylate and epoxy.

13. The conductive ink of claim 1, wherein the catalyst is a free radical initiator.

14. The conductive ink of claim 13, wherein the free radical initiator is a peroxide, azo compound, or combination of any two or more thereof.

15. The conductive ink of claim 14, wherein the free radical initiator is selected from the group consisting of dicumyl peroxide, dibenzoyl peroxide, 2-butanone peroxide, tert-butyl perbenzoate, di-tert-butyl peroxide, 2,5-bis(tert-butylperoxy) -2,5-dimethylhexane, bis(tert-butyl peroxyisopropyl) benzene, tert-butyl hydroperoxide, and mixtures of any two or more thereof.

16. The conductive ink of claim 1, wherein the particulated electrically conductive material is selected from the group consisting of silver, copper, silver-coated copper, gold-coated copper, silver-coated aluminum, gold-coated aluminum, coated mica, glass spheres, and mixtures of any two or more thereof.

17. The conductive ink of claim 1 wherein the organic solvent is present and is selected from the group consisting of a hydrocarbon, ether, alcohol, ester, ketone, and mixtures of any two or more thereof.

18. The conductive ink of claim 17 wherein the organic solvent is an ester.

19. The conductive ink of claim 18 wherein the ester is amyl acetate.

20. The conductive ink of claim 1, wherein the flow additives are selected from the group consisting of silicon polymers, ethyl acrylate/2-ethylhexyl acrylate copolymers, alkylol ammonium salt of acid phosphoric acid esters of ketoxime, and mixtures of any two or more thereof.

21. The conductive ink of claim 1, wherein the adhesion promoter is a silane with a curable functional group.

22. The conductive ink of claim 21 wherein the curable functional group is a carbon—carbon double bond or an epoxy.

23. The conductive ink of claim 21, wherein the adhesion promoter is selected from the group consisting of a mercaptosilane, an epoxysilane, an aminosilane, a trialkoxysilyl isocyanurate, and mixtures of any two or more thereof.

24. The conductive ink of claim 1, wherein the rheology modifier is a thixotrope.

25. The conductive ink of claim 1, wherein the rheology modifier is a thermoplastic resin.

26. The conductive ink of claim 25, wherein the rheology modifier is selected from the group consisting of a polystyrene-polybutadiene copolymer, a poly(methyl methacrylate), a poly(ethyl methacrylate), a polyvinyl acetal, and mixtures of any two or more thereof.

27. The conductive ink of claim 1, wherein the electrical enhancer is selected from the group consisting of hydroquinone, Vitamin E, metallic dryers, metallic (meth)acrylates, titanates, phosphoric acid, and mixtures of any two or more thereof.

28. A process for producing a conductive layer or coating comprising applying an ink of claim 1 to a substrate.

29. The process of claim 28, wherein the substrate is a printed wiring board.

30. The process of claim 29, wherein the printed wiring board is an epoxy glass-type printed wiring board or a phenolic-type printed wiring board.

31. The process of claim 28, wherein the substrate is a capacitor component.

32. The process of claim 28, wherein the ink is applied to the substrate by dipping or screen printing.

33. An article comprising a substrate containing a cured aliquot of a composition of claim 1.

34. The article of claim 33, wherein the substrate is a printed wiring board or a capacitor component.

* * * * *